United States Patent [19]
Shirai et al.

[11] Patent Number: 5,568,347
[45] Date of Patent: Oct. 22, 1996

[54] LOAD DRIVING CIRCUIT WITH PROTECTIVE CIRCUIT

[75] Inventors: Katsuhiko Shirai, Okazaki; Kazunori Kurokawa, Nagoya; Takashi Harada, Hekinan, all of Japan

[73] Assignee: Nippondenso Co., Ltd., Kariya, Japan

[21] Appl. No.: 305,292

[22] Filed: Sep. 15, 1994

[30] Foreign Application Priority Data

Sep. 16, 1993 [JP] Japan .................................. 5-230418

[51] Int. Cl.⁶ .................................................. H02H 9/02
[52] U.S. Cl. ........................ 361/98; 361/79; 361/87; 361/103; 361/24
[58] Field of Search .......................... 361/79, 87, 93, 361/98, 24, 57, 103

[56] References Cited

FOREIGN PATENT DOCUMENTS

| | | |
|---|---|---|
| 60-83418 | 5/1985 | Japan . |
| 63-229757 | 9/1988 | Japan . |
| 1249941 | 10/1989 | Japan . |
| 2301802 | 12/1990 | Japan . |
| 357314 | 3/1991 | Japan . |
| 3103630 | 10/1991 | Japan . |
| 5162631 | 6/1993 | Japan . |
| 5175814 | 7/1993 | Japan . |

Primary Examiner—Jeffrey A. Gaffin
Assistant Examiner—Michael J. Sherry
Attorney, Agent, or Firm—Cushman Darby & Cushman

[57] ABSTRACT

A driving circuit for driving a given load based on a load control signal is provided which includes a power transistor, a protective circuit, and a power transistor control circuit. The power transistor is responsive to the load control signal inputted to the driving circuit to be turned on for activating the load. The protective circuit is arranged to be activated by the load control signal to monitor a malfunction of the power transistor caused by overheating or overcurrent flow to restrict an operation of the power transistor. The power transistor control circuit is arranged to prohibit the power transistor from being turned on until the load control signal reaches a preselected level required for operating the protective circuit stably. The power transistor control circuit may alternatively be designed to neglect an operation of the protective circuit until the load control signal reaches the preselected level required for operating the protective circuit stably to prohibit the protective circuit from restricting the operation of the power transistor.

12 Claims, 6 Drawing Sheets

5,568,347

1

LOAD DRIVING CIRCUIT WITH PROTECTIVE CIRCUIT

BACKGROUND OF THE INVENTION

1. Technical Field of the Invention

The present invention relates generally to a driving circuit including a power transistor operable to drive a load based on a load control signal pro, tided through, for example, a CPU. The driving circuit includes a C-MOS gate and a protective circuit designed to monitor overheating and overcurrent flow in the power transistor and to restrict an operation thereof so as to protect it from damage caused by the overheating and/or overcurrent flow. More particularly, the invention is directed to an improved circuit arrangement of such a driving circuit which does not refine an additional power terminal for the protective circuit.

2. Background Art

FIG. 6 shows a conventional driving circuit 30 known in the art.

The driving circuit 30 includes a power transistor 31 (n-channel power MOS-FET), an AND circuit 32, and a protective circuit 33 for monitoring overheating or overcurrent flow in the power transistor. The power transistor 31 has a drain connected to a load 40 through a drain terminal D and a source connected to ground through a source terminal S. The protective circuit 33 receives a power supply from a power terminal Vcc and has a grounding terminal connected to ground. The AND circuit 32 provides an output signal to a gate electrode of the power transistor 31 through a resistor R when a load control signal inputted to a gate terminal G and a output signal from the protective circuit 33 indicative of a malfunction of the power transistor caused by overheating and/or overcurrent flow are both inputted simultaneously.

In operation, the AND circuit 32 supplies the load control signal inputted to the gate terminal G to the gate electrode of the power transistor 31 under the condition that a malfunction due to overheating and/or overcurrent flow is not detected by the protective circuit 33. The power transistor 31 is then turned on to allow electric current supplied from a power source (+B) to flow through the load 40 connected to drain terminal D. When the protective circuit 33 detects a malfunction of power transistor 31, the AND circuit 32 prohibits the load control signal from being applied to power transistor 31, thereby turning off power transistor 31 so as to protect it from damage due to the malfunction condition.

The load 40 may include an inductance load such as a relay or solenoid or a lamp load. The driving circuit 30 may be incorporated in, for example, an automotive vehicle, and adapted to electrically operate control valves so as to control various engine operating conditions according to a control signal prodded by an electric control unit of an engine. In this case, the load, control signal inputted to the gate terminal G is usually, as shown in the drawing, provided by a CPU 10 through a C-MOS gate 20 of the electric control unit.

The above driving circuit, as clear from the drawing, requires separate power terminals Vcc and grounding terminal GND for the protective circuit 33 in addition to the gate terminal G, the drain terminal D, and the source terminal S. In other words, compared with a typical bipolar power transistor, the driving circuit additionally requires the power terminal Vcc, the grounding terminal GND, and lead wires therefore. This means that a special circuit board must be designed for such a driving circuit.

2

In addition, since an electric current on the order of from several amps to several hundreds of milliamps usually flows through the power transistor 31 to drive the load 40, a thick lead wire (e.g., a lead wire having a width of more than 3 mm) must preferably be arranged, particularly, between a drain and a source of the power transistor. However, since a lead wire connected to the power terminal Vcc and the grounding terminal GND extends adjacent the power transistor 31, it is impossible to secure a sufficient width of lead wire around the power transistor. A thick lead wire around the power transistor may be arranged by increasing the distance between the power transistor and the protective circuit, but this decreases packaging density.

Japanese Patent First Publication No. 63-229757 teaches a driving circuit with temperature and overcurrent protective circuits. The protective circuits derive power from an input signal provided to the protective circuits and are grounded to a grounding terminal (i.e., a source) of the power transistor. With this circuit arrangement, it is possible to mount circuit elements at high density and at the same time to connect the desired width of lead wire to the power transistor. Furthermore the whole circuit arrangement is simplified and interchangable with another circuit excluding a protective circuit. This prior art driving circuit, however, encounters the following drawback. Since either the temperature protective circuit or the overcurrent circuit uses an analog signal to detect abnormal behavior of the driving circuit and to restrict a signal from being supplied to a gate of the power transistor, the detection accuracy is low. Particularly, the overcurrent protective circuit is adversely affected by variations in temperature and environmental conditions as well as by manufacturing variations. Therefore, in order to accurately protect the power transistor from overheating or overcurrent flow therethrough, it is necessary to detect occurrence of the overheating and overcurrent flow using logic circuits such as gate circuits, a constant current sources, and comparators. A special power terminal and grounding terminal such as those shown in FIG. 6 are thus required to establish stable operation of the protective circuit.

SUMMARY OF THE INVENTION

It is therefore a principal object of the present invention to avoid the disadvantages of the prior art.

It is another object of the present invention to provide a driving circuit which has a protective device including logical circuits arranged to monitor a malfunction of the driving circuit caused by overheating or overcurrent flow and which has an improved circuit arrangement which secures a stable operation of the protective device without the need for a special power terminal.

According to one aspect of the present invention, there is provided a driving circuit for driving a given load based on a load control signal which comprises a switching element responsive to the load control signal inputted to the driving circuit to be turned on for activating the load, a protective circuit means for monitoring a malfunction of the switching element to restrict an operation of the switching element, the protective circuit means being arranged to be activated by, the load control signal, and a switching element activation control circuit arranged to prohibit the switching element from being turned on until the load control signal reaches a preselected level required for activating the protective circuit means into a preselected operational condition.

In the preferred mode, the switching element is interposed between a power source and a ground through the load, and is responsive to the load control signal to be turned on for allowing electric current supplied from the power source to flow therethrough to activate the load.

The protective circuit means restricts electric current flow through the load when the switching element malfunction. The protective circuit means has a grounding terminal connected to a grounding terminal of the switching element. A current flow restriction means is further provided to restrict a power supply to the protective circuit means.

The protective circuit means includes an overheating protective circuit and an overcurrent protective circuit. The overheating protective circuit is arranged to monitor overheating of the switching element, while the overcurrent protective circuit is arranged to monitor excessive current flow through the switching element.

The overheating protective circuit includes a diode whose forward voltage varies dependent upon variation in temperature of the driving circuit and produces a malfunction detected signal when the forward voltage of the diode varies by a preselected level. The protective circuit means is responsive to the malfunction detected signal to restrict the operation of the switching element.

The overcurrent protective circuit is arranged to monitor the electric current flowing through the load and to determine the occurrence of overcurrent flow through the switching element. The overcurrent protective circuit may include a resistor interposed between the switching element and the ground, and is responsive to a variation in potential difference appearing across the resistor to detect the excessive current flow through the switching element.

The overcurrent protective circuit may alternatively include an element which responds to an electric current flow through the switching element greater than a given level by controlling operation of the switching element so as to restrict the amount of electric current flow through the switching element.

According to another aspect of the present invention, there is provided a driving circuit for driving a given load based on a load control signal which comprises a switching element responsive to the load control signal inputted to the driving circuit to be turned on for activating the load, a protective circuit means for monitoring a malfunction of the switching element to provide a malfunction detected signal for restricting an operation of the switching element, the protective circuit means being arranged to be activated by the load control signal and a switching element activation control circuit responsive to the malfunction detected signal provided from the protective circuit means to have the protective circuit means restrict the operation of the switching element, the switching element activation control circuit including means for neglecting the malfunction detected signal from the protective circuit means until the load control signal reaches a preselected level required for activating the protective circuit means into a given operational condition.

According to a further aspect of the invention, there is provided a driving circuit for driving a given load based on a load control signal which comprises a power transistor responsive to the load control signal inputted to the driving circuit to activate the load, a power terminal for supplying the load control signal to the driving circuit as electric power, a grounding terminal for connecting the driving circuit to ground, a drain terminal for connecting between the power transistor and the load to have electric current flow therethrough under activation of the power transistor, a switching circuit, arranged to selectively allow and block electric current flow through the drain terminal, connected to the power terminal through a first detection circuit which is operable to detect a first condition where a voltage of the power terminal is greater than a given level, and a second detection circuit detecting a second condition indicative of overheating or excessive current flow in the power transistor. The second detection circuit is connected to the power terminal. The switching circuit is turned on when the first detection circuit detects the first condition and the second detection circuit does not detect the second condition. The first and second detection circuit and the power transistor are connected to the grounding terminal.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for the purpose of explanation and understanding only.

In the drawings.

DESCRIPTION OF THE PREFERRED EMBODIMENT

Figure 1:
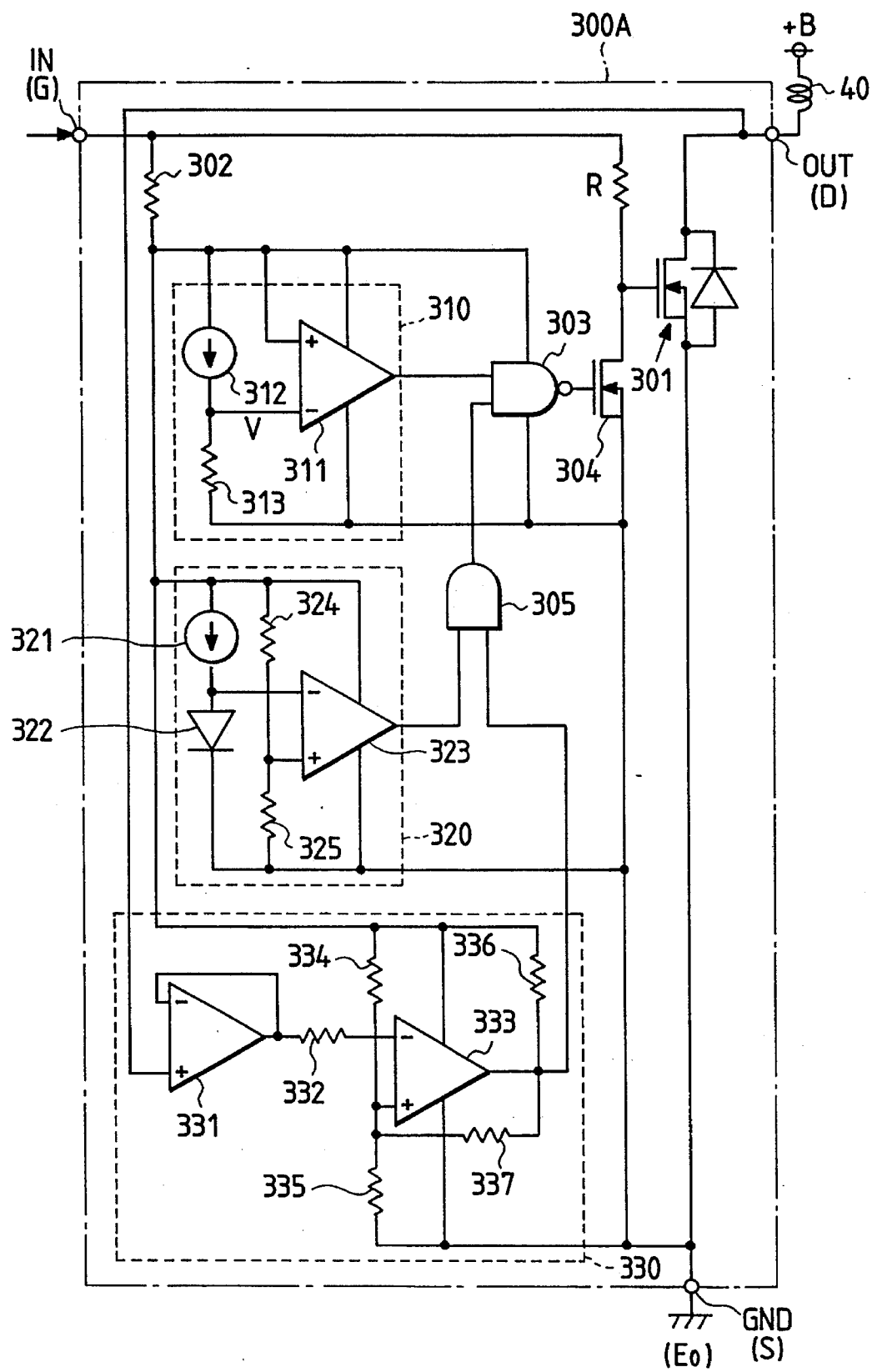
FIG. 1 is a circuit diagram which shows a driving circuit with protective circuits according to the present invention.
Figure 6:
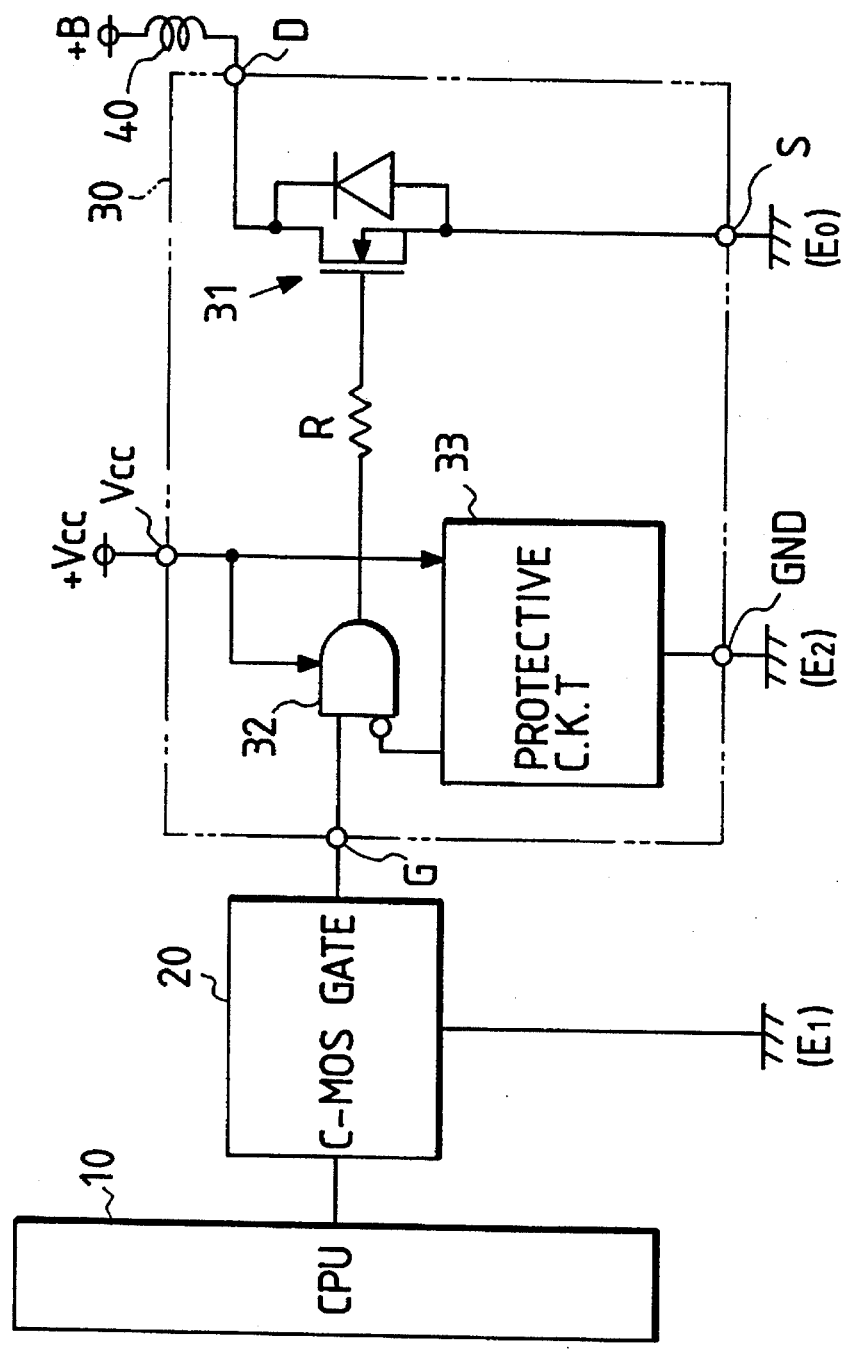
FIG. 6 is a 13 lock diagram which shows a conventional driving circuit with a protective circuit.

In the drawings, like numbers refer to like parts in several views. In FIG. 1, particularly there is shown a driving circuit 300A according to the present invention which is designed to drive n inductance load such as a relay a solenoid or a lamp. The driving circuit 300A may be used with, for example, an electric control unit for an automotive vehicle engine, such as that shown in FIG. 6, which electrically operates various valves to control engine operational conditions.

The driving circuit 300A includes generally a power transistor (n-channel power MOS-FET) 301, a NAND circuit 303, a transistor (MOS-FET) 304, hysteresis circuit 310, an overheating protective circuit 320, an overcurrent protective circuit 330, an AND circuit 305, and a resistor 302.

The power transistor 301 has a drain electrode connected to a load 40 through an output terminal OUT (i.e., a drain terminal D) and a source electrode connected to ground through a grounding terminal GND (a source terminal S). The hysteresis circuit 310 is designed to provide, under activities of the NAND circuit 303 and the transistor 304, given hysteresis (lag) to a signal (i.e., a load control signal) inputted to am input terminal IN (i.e., a gate terminal G of the power transistor 301). The overheating protective circuit 320 is arranged to protect the power transistor 301 against overheating, while the overcurrent protective circuit 330 protects the power transistor 301 from damage due to excessive current flow. The AND circuit 305 is responsive to malfunction detected signals from both protective circuits 320 and 330 to provide an output signal to an input terminal of the NAND circuit 303. The resistor 302 is arranged to limit the electric current level of the load control signal inputted from the input terminal IN by an amount required to supply power to the hysteresis circuit 310, the overheating current 320, and the overcurrent circuit 330.

The driving circuit 300A, as clear from the drawing, has grounding terminals of the hysteresis circuit 310, the overheating circuit 320, and the overcurrent circuit 330 connected to a grounding terminal of the power transistor 310, or the grounding terminal GND, to form a three-terminal circuit structure.

The hysteresis circuit 310 includes a comparator 311, a constant current source 312, and a resistor 313. The comparator 311 receives through its positive input terminal the input signal passing through the resistor 302, while a threshold voltage, or reference voltage Vf, is applied to a negative terminal thereof from the constant current source 3 12 and the resistor 313. The reference voltage Vf includes a given fraction of the input signal passing through the resistor 302. For example, when a logic high level of the input signal is 4.5 V, the reference voltage Vf is set to about 3 V in consideration of a common junction of the grounding terminals of the logic circuits, i.e., the junction of the grounding terminals of protective circuits 320 and 330 to the groundling terminal of power transistor 301.

Generally, a potential difference will appear across a grounding terminal of a logic circuit and a power circuit. This is because when a power transistor (i.e., the power circuit) is turned on, it will cause a large current to flow therethrough so that its ground potential rises. For example, in the circuit arrangement shown in FIG. 6, if a ground potential of the power transistor is defined as E0 and a ground potential of the logic circuit is defined as E1 or E2, these ground potentials, when the power transistor is turned on, can be expressed by the following relation.

E0 (ground potential of the power transistor)>E2 (ground potential of the protective circuit) or E1 (ground potential of the gate circuit)

It is generally known that a difference between the above ground potentials is on the order of 1.5 V. However, in the driving circuit 300A, wherein the grounding terminals of the logic circuit including the hysteresis circuit 310, the NAND circuit 303, and the AND circuit 305 as well as the protective circuits 320 and 330 are all connected to the grounding terminal of the power transistor 301, the ground potential (E2) of the logic circuit is elevated to the ground potential (E0) of the power transistor 301. Thus, a potential difference, as expressed below, appears between these potentials and the ground potential (E1) of a gate circuit, such as the C-MOS gate 20 shown in FIG. 6, if connected to the input terminal IN.

E2 (ground potential of the protective circuit equal to ground potential of the power transistor E0)>E1 (ground potential of the gate circuit)

Therefore, even when an operating voltage of the gate circuit arranged prior to the driving circuit 300A is 4.5 V, the above potential difference ($\approx$1.5 V) causes a voltage only of the order of 3 V to be provided to the driving Circuit 300A. For this reason, in order to operate the protective circuits 320 and 330 properly at that voltage level, it is necessary to design the circuit so that they can be activated on 3 V.

In the driving circuit 300A of this embodiment, the resistor 302, having a resistance of the order of 1 k$\Omega$, is disposed on an electric supply line or feeder connected to the hysteresis circuit 310 and the protective circuits 320 and 330 in order to restrict electric current flowing therethrough. Furthermore, a circuit constant is so selected that the circuits 310, 320, and 330 can operate on a voltage of the order of 3 V. This voltage is applied, as the reference voltage Vf, to the negative input terminal of the comparator 311 of the hysteresis circuit 310, and represents the minimum voltage or operating voltage required to secure stable operations of the protective circuits 320 and 330. Therefore, the comparator 311 outputs a logic high level signal when a voltage greater than the reference voltage Vf (=3 V) inputted to its positive input terminal. At least when the output from the hysteresis circuit 310 (i.e., the comparator 311) represents a logic low level, the NAND circuit 303 works to hold the transistor 304 on, so as to inhibit the power transistor 301 from being turned on. In other words, as long as the input signal is below the operating voltage of the protective circuits 320 and 330, the power transistor is prohibited from being turned on.

The overheating protective circuit 320 includes a constant current source 321, a diode 322, a comparator 323, and resistors 324 and 325 for providing a reference voltage of the comparator 323. The comparator 323 has its negative input terminal connected to an anode of the diode 322, while the reference voltage produced by the resistors 324 and 325 is applied to a positive input terminal thereof. The overheating protective circuit 320 utilizes the temperature-dependent variation in forward voltage of the diode 322 to protect the power transistor 301 (i.e., the driving circuit 300A) against damage resulting from overheating. When the power transistor 301 overheats due to, for example, a short circuit of the load 40, the forward voltage of the diode 322 exceeds the reference voltage. Accordingly, comparator 323 provides a signal of logic low level indicative of a malfunction caused by the overheating.

The overcurrent protective circuit 330 includes a buffer circuit 331 to which the output of the driving circuit 300A (i.e., a drain current of he power transistor 301) is inputted, a resistor 332, a comparator 333, a pair of resistors 334 and 335 for voltage dividing, and a pair of resistors 336 and 337 to adjustment the output of comparator 333. The comparator 333 receives at its negative input terminal an output signal of the driving circuit 300A through the buffer circuit 331, while a reference voltage provided by the resistors 334 and 335 is inputted to a positive input terminal thereof. With these arrangements, when a signal level inputted to the overcurrent protective circuit 330 (i.e., to comparator 333) exceeds the reference voltage due to, for example, a short circuit of the load 40 or a wire harness to a power source (+B), the comparator 333 provides an output signal of logic low level indicative of the overcurrent flow through the power transistor 301.

In the above manner, the overheating protective circuit 320 and the overcurrent protective circuit 330, when the driving circuit 300A operates normally, receive a detecting signal of logic high level, while they receive a detecting signal of logic low level when a malfunction occurs in the driving circuit 300A. The AND circuit 305 is responsive to output signals from the overheating protective circuit 320 and the overcurrent protective circuit 300 during the normal operation of the driving circuit 300A to provide a signal of logic high level to the NAND circuit 303, while it outputs a signal of logic low level to the NAND circuit 303 when a malfunction-detected signal is outputted from either or both of the overheating protective circuit 320 and the overcurrent protective circuit 330.

The NAND Circuit 303 produces an output signal of logic low level only when all inputs represent a logic high level, while when either or both of inputs are at a logic low level, the output signal represents a logic high level. Therefore, when a malfunction in operation of the driving circuit 300a is detected even after the output from the hysteresis circuit 310 has been changed to the logic high level, the NAND circuit 303 changes its output signal to logic high level which turns on the transistor 304, thereby turning off the power transistor 301 forcibly.

Figure 2:
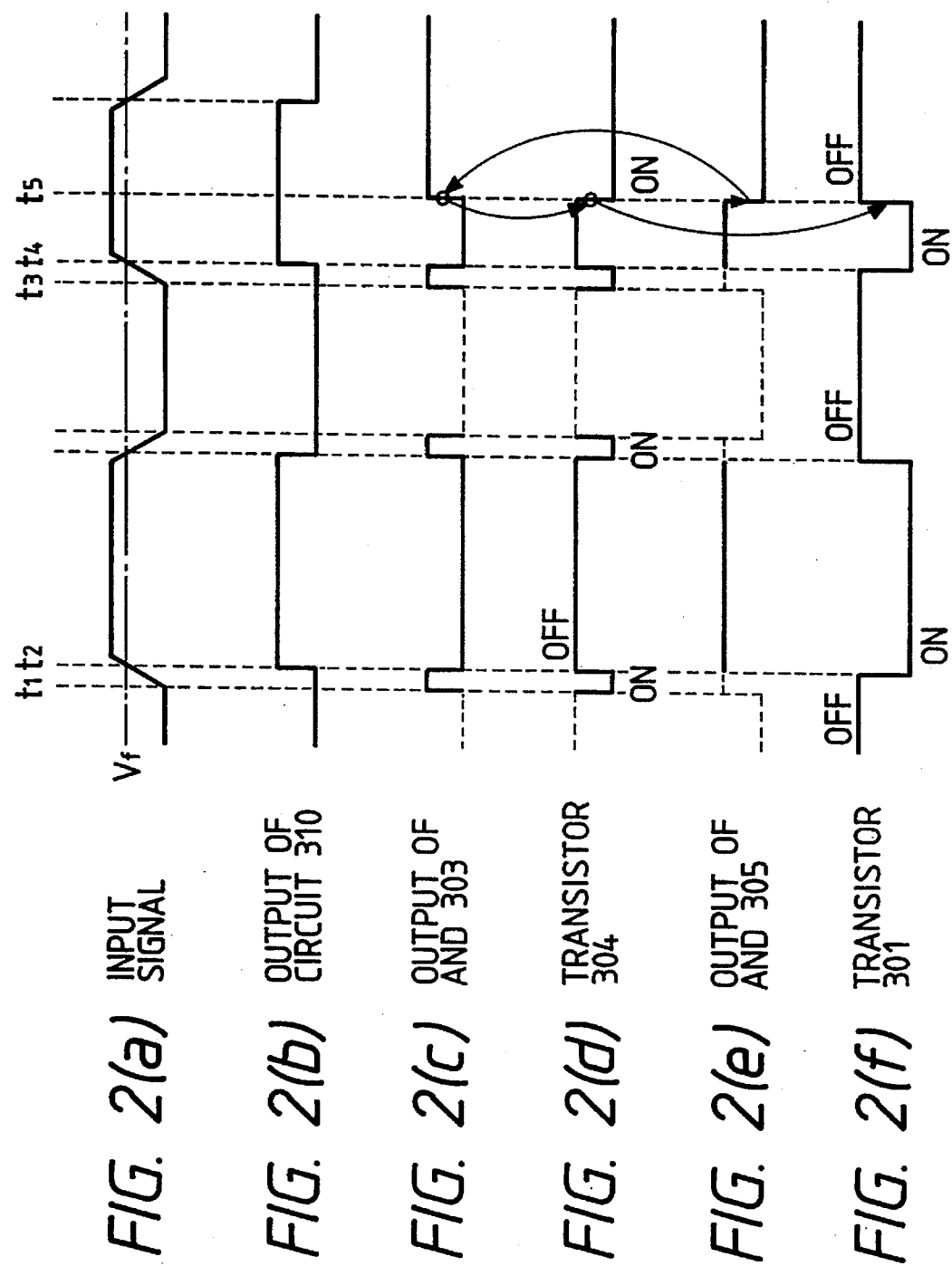
FIGS. 2(a) to 2(f) are timing charts which show operational relations among circuit elements of a driving circuit in relation to variation in input signal level.

FIG. 2 showing the whole operation of the driving circuit 300A.

The driving circuit 300A monitors, based on the reference voltage Vf, whether a signal level of the input signal (i.e., load control signal shown in FIG. 2(a)) to the input terminal IN has reached the operating voltage of the protective circuits 320 and 330. In FIG. 2(a), slopes of leading and falling edges of the input signal are shown more smoothly than it actually is for the convenience of illustration.

When the input signal rises at a time t1 and then exceeds the reference voltage Vf at a time t2, an output signal from the hysteresis circuit 310 to the NAND circuit 303, as shown in FIG. 2(b), changes to logic high level.

During a period from t1 to t2, the output signal from the hysteresis circuit 310 is, as shown, maintained at logic low level. The output from the NAND circuit 303 is, therefore, as shown in FIG. 2(c), changed to logic high level so that the transistor 304 is, as shown in FIG. 2(d), turned on. During the turning on of the transistor 304, an electric potential of the gate of the power transistor 301 is maintained at ground potential so that it is, as shown in FIG. 2(f), prohibited from being turned on.

When the output signal from the hysteresis circuit 310 becomes logic high level at the time t2, the output signal of the NAND circuit 303 is, as shown in FIG. 2(c), changed to logic low level under the condition that the output of the AND circuit 305 represents logic high level, that is, that the overheating protective circuit 320 and the overcurrent protective circuit 330 monitors no malfunction of the driving circuit 330A. This causes the transistor 304 to be turned off, as shown in FIG. 2(d). A gate electric potential of the power transistor 301 is then elevated to the electric potential of the input signal so that it is, as shown in FIG. 2(f), turned on to allow electric current to be supplied to the load 40 connected to the output terminal OUT.

When the input signal, as shown in FIG. 2(a), begins to rise again at a time 3 and then exceeds the reference voltage Vf at a time t4, the hysteresis circuit 310, the NAND circuit 303, the transistor 304, the AND circuit 305, and the power transistor 301 act in the same manner as described above, after which their operational conditions are maintained as shown in FIGS. 2(b) to 2(f). However, when at a time t5, a malfunction caused by overheating or overcurrent flow through the driving circuit 300A is detected either by the overheating protective circuit 320 or the overcurrent protective circuit 330, the AND circuit 305, as shown in FIG. 2(e), lowers its output to logic low level. This will cause the NAND circuit 303 to provide, as shown in FIG. 2(c), an output signal of logic high level, thereby turning on the transistor 304, as shown in FIG. 2(d). In response to the turning on operation of the transistor 304, a gate electric potential of the power transistor 301 is lowered to ground potential level so that it is, as shown in FIG. 2(f), turned off for protecting the driving circuit 300A against the overheating or overcurrent flow.

With the circuit arrangement of the driving circuit 300A as discussed above, the input signal appearing on the input terminal IN is provided as power supply to the overheating protective circuit 320 and the overcurrent protective circuit 330, thereby eliminating the need for a special power terminal and a feeder therefor. Additionally, the Overheating protective circuit 320 and the overcurrent protective circuit 330 are connected to ground through the ground terminal of the power transistor 301, thereby eliminating the need for a special ground terminal. Therefore, it is possible to make the driving circuit including the protective circuits with a simple circuit structure having only three terminals: the input terminal IN, the output terminal OUT, and the grounding terminal GND. Further, the elimination of the need for the power terminal and the grounding terminal for the protective circuits makes it possible to mount circuit elements at high density while securing a desired width of lead wires.

In addition, when the electric power for the protective circuits 320 and 330 is provided from the input signal to the input terminal IN, during a transient state immediately after the input signal is applied to the input terminal IN, the operations of the protective circuits 320 and 330, although they are designed to accurately detect a malfunction of the driving circuit 300A caused by the overheating or overcurrent flow as discussed above, are not always secured. This disadvantage is, however, overcome by providing the hysteresis circuit 310 to deactivate the power transistor 301 in cooperation with the NAND circuit 304 and the transistor 304 until a level of the input signal used as power supply to the protective Circuits 320 and 330 reaches a given level enough to operate these protective circuits stably. This results in greatly improved reliability of the whole operation of the driving circuit 300A.

The common connection of the grounding terminals of the protective circuits 320 and 330 to the grounding terminal of the power transistor 301 may cause the ground potential of the driving circuit 300A to rise over the ground potential of a logic circuit arranged prior thereto (e.g. the C-MOS gate 20 in FIG. 6), resulting in lack of electric potential provided to the logic circuits of the driving circuit 300A (i.e., hysteresis circuit 310, NAND circuit 303, AND circuit 305, and protective circuits 320 and 330) and leading to failures thereof. These are, however, overcome by arranging the resistor 302 to limit the current flow of the input signal supplied as power source to the logic circuits by increasing their input impedance, thereby assuring stable operations of the logic circuits at the lower voltage.

Figure 3:
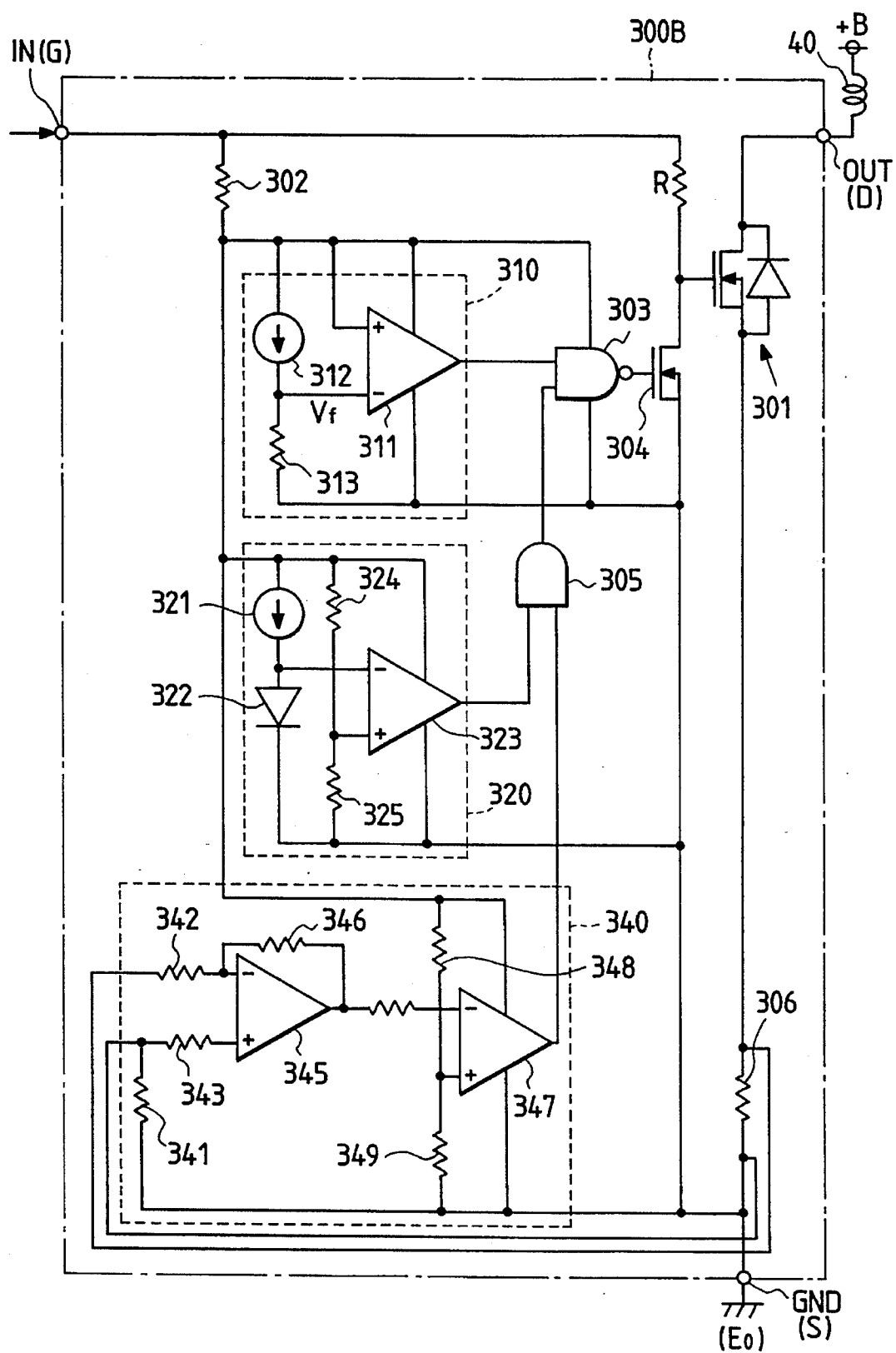
FIG. 3 is a circuit diagram which shows a driving circuit with protective circuits according to a second embodiment of the present invention.

As shown in FIG. 3, an alternative driving circuit 300B according to the present invention differs from the above first embodiment only in a structure of an overcurrent protective circuit. Other circuit arrangements are the same and explanation thereof in detail will be omitted here.

An overcurrent protective circuit 340 is arranged to take in a malfunction-monitoring signal based on electric potential appearing across a shunt resistor 306 interposed between a source electrode of the power transistor 301 and the grounding terminal GND. The overcurrent protective circuit 340 includes input signal resistors 342, 341, and 343 connecting with the shunt resistor 306, a differential amplifier 345 into which both voltage signals of the shunt resistor 306 are inputted, a feedback resistor 346 of the differential amplifier 345, a comparator 347, and voltage-dividing resistors 348 and 349 for providing a reference voltage to be applied to the comparator 347. The comparator 347 receives through its negative input signal an output from the differential amplifier 345, while the reference voltage produced by the voltage-dividing resistors 348 and 349 is inputted to a positive input terminal thereof. With these arrangements, the overcurrent protective circuit 340 has the differential amplifier 345 be responsive to overcurrent flow through the shunt resistor 306 due to a short circuit of the load 40 to produce an output signal greater than the reference voltage. The comparator 347 is responsive to this output signal to provide a signal of logic low level. Thus, when a malfunction-detected signal is outputted from either or both of the overheating protective circuit 320 and the overcurrent protective circuit 340, the power transistor 301 is turned off in the same manner as described above.

Figure 4:
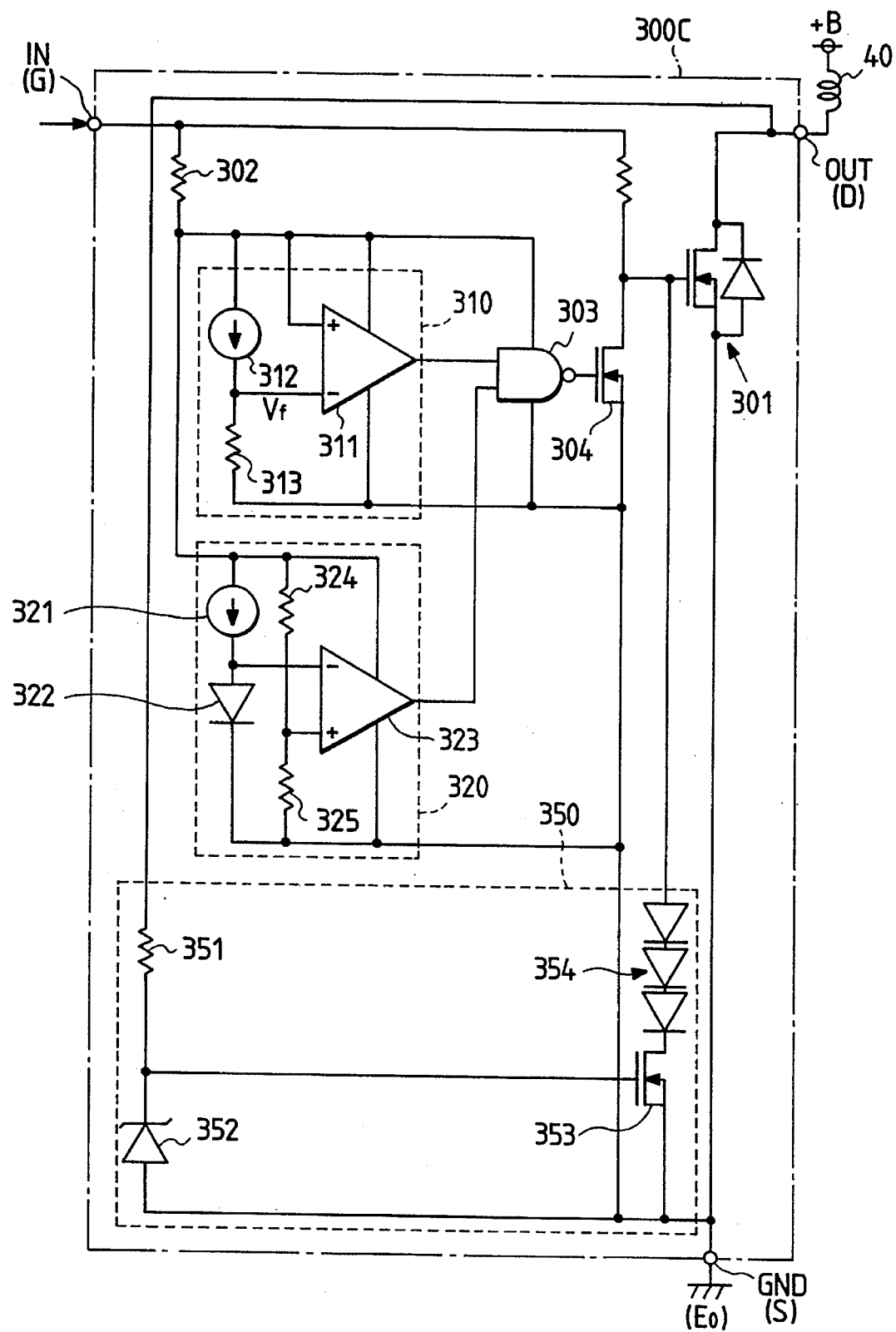
FIG. 4 is a circuit diagram which shows a driving circuit with protective circuits according to a third embodiment of the present invention.

As shown in FIG. 4, a driving circuit 300C according to a third embodiment includes an overcurrent protective circuit 350.

The overcurrent protective circuit 350 is designed to be responsive to overcurrent flow through the power transistor 301 to restrict the amount of electric current flowing through the power transistor 301 without blocking output current flow therefrom. The overcurrent protective circuit 350 includes a resistor 351 connected to the output terminal OUT of the driving circuit 300C and a drain electrode of the power transistor 301, a zener diode 352 interposed between the resistor 351 and the grounding terminal GND, a transistor (MOS-FET) 353 having a gate electrode connected to a cathode of the zener diode 352, and a diode array 354 interposed between a gate electrode of the power transistor 301 and a drain electrode of the transistor 353 in the illustrated manner.

In operation, when a large current flows through the power transistor 301 due to a short circuit of the load 40, an ON-resistance of the power transistor is increased to elevate an electric potential of the output terminal OUT. When the electric potential of the output terminal OUT exceeds an ON-voltage of the transistor 353, it will cause the transistor 353 to be turned on so that a gate electric potential of the power transistor 301 drops to restrict the output current flow therethrough.

The above circuit structure of the overcurrent protective circuit 350 prevents, for example, bonding wires from being broken due to the overcurrent flow prior to activation of the overheating protective circuit 320.

Figure 5:
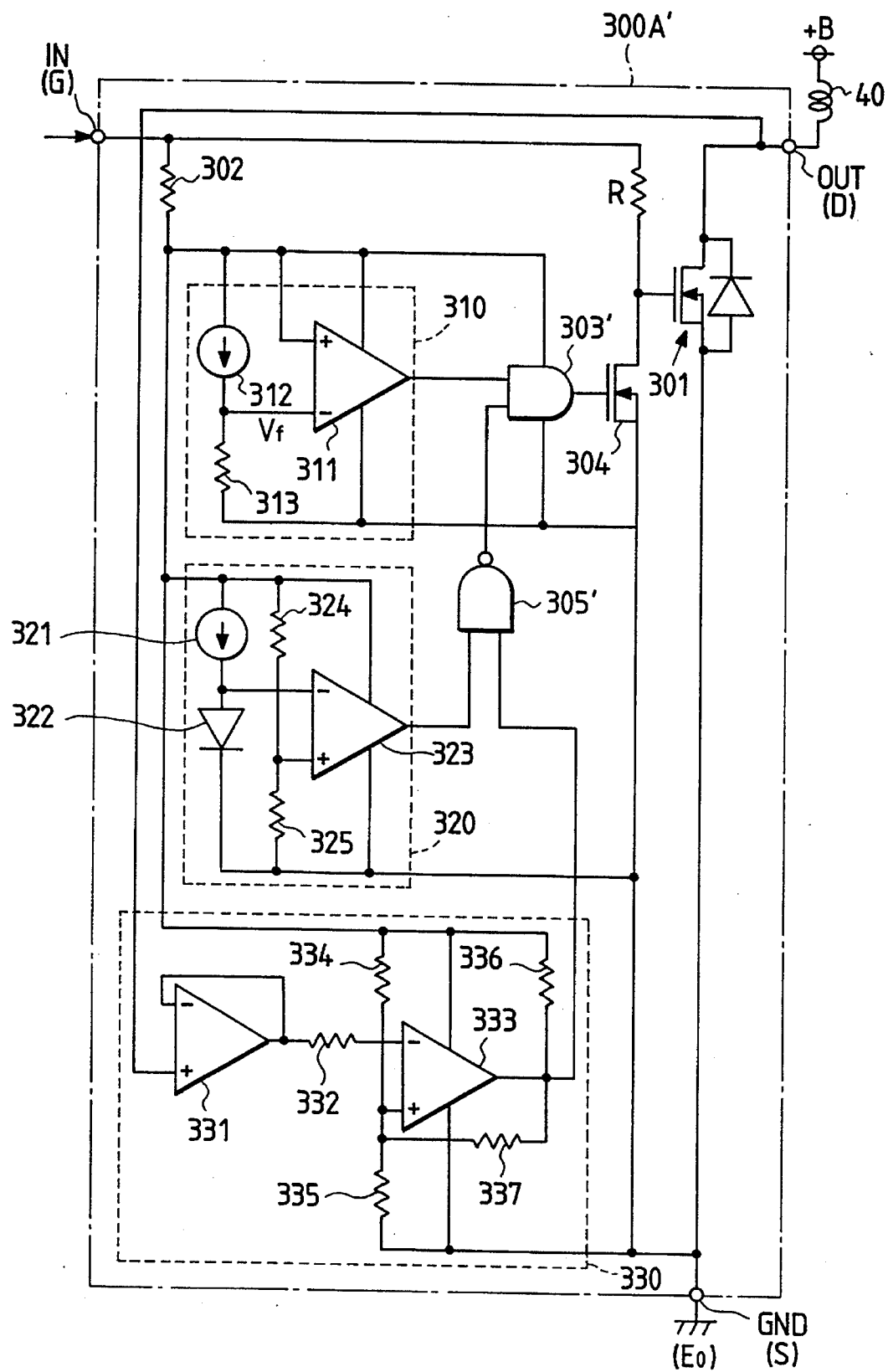
FIG. 5 is a circuit diagram which shows a driving circuit with protective circuits according to a fourth embodiment of the present invention.

In any of the above mentioned driving circuits 300A to 300C, the power transistor 301 is prohibited from being turned on until a signal level of the input signal applied to the input terminal IN reaches the given level sufficient for operating the protective circuits stably. It should be noted, however, that the present invention is not limited to same and that a circuit arrangement may be used which deactivates the protective circuits until the signal level of the input signal applied to the input terminal IN reaches the given level enough to operate the protective circuits stably. FIG. 5 shows a modification of the driving circuit 300A of the first embodiment which is designed to restrict the operations of the protective circuits until the input signal to the driving circuit reaches a desired level.

A driving circuit 300A' shown in FIG. 5 has an AND circuit 303' in place of the NAND circuit 303 of the driving circuit 300A and a NAND circuit 305' instead of the AND circuit 305 of the driving circuit 300A.

With these arrangements, until an output signal from the hysteresis circuit 310 rises from low to high levels, that is, a signal level of the input signal to the input terminal IN reaches a given level (3 V) required for stably operating the protective circuits 320 and 330, outputs provided by these protective circuits, if they represent either logic low or high, are neglected through the AND circuit 303' so that the transistor 304 is deactivated.

When the input signal to the input terminal IN reaches the given level (3 V) s that the output from the hysteresis circuit 310 changes to high level, the output from the NAND circuit 305' becomes effective Thus, when the protective circuit 320 or 330 provides a signal of logic low level indicative of overheating of or excessive current flow through the power transistor 301, the output of the NAND circuit 305' rises from low to high to turn on the transistor 304.

The above Circuit arrangements may be used with the driving circuits 300B and 300C of the second and third embodiments While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. A driving circuit for driving a load based on a load control signal comprising:

a switching element responsive to the load control signal inputted to the driving circuit, said switching element being turned on for activating the load;

protective circuit means for monitoring a malfunction of said switching element and for restricting an operation of said switching element in response to the malfunction, said protective circuit means being arranged to be activated by the load control signal; and a switching element activation control circuit arranged to prohibit said switching element from being turned on until the load control signal reaches a preselected level required for stable operation of said protective circuit means to correctly monitor the malfunction of said switching element.

2. A driving circuit as set forth in claim 1, wherein said switching element is interposed between a power source and a ground through the load, said switching element being responsive to the load control signal to be turned on for allowing electric current supplied from the power source to flow therethrough to activate the load.

3. A driving circuit as set forth in claim 2, wherein said protective circuit means restricts electric current flow through the load when the malfunction of said switching element occurs.

4. A driving circuit as set forth in claim 2, wherein said protective circuit means has a grounding terminal connected to a grounding terminal of said switching element, current flow restriction means being further provided to restrict a power supply to said protective circuit means.

5. A driving circuit as set forth in claim 2, wherein said protective circuit means includes an overheating protective circuit and an overcurrent protective circuit, the overheating protective circuit being arranged to monitor overheating of said switching element, the overcurrent protective circuit being arranged to monitor excessive current flow through said switching element.

6. A driving circuit as set forth in claim 5, wherein the overheating protective circuit includes a diode whose forward voltage varies dependent upon variation in temperature of the driving circuit, the overheating protective circuit producing a malfunction detected signal when the forward voltage of the diode is changed over a preselected level, said protective circuit means being responsive to the malfunction detected signal to restrict the operation of said switching element.

7. A driving circuit as set forth in claim 5, wherein the overcurrent protective circuit is arranged to monitor the electric current flowing through the load to determine occurrence of the overcurrent flow through said switching element.

8. A driving circuit as set forth in claim 5, wherein the overcurrent protective circuit includes a resistor interposed between said switching element and the ground, the overcurrent protective circuit being responsive to a variation in potential difference appearing across the resistor to detect the excessive current flow through said switching element.

9. A driving circuit as set forth in claim 5, wherein the overcurrent protective circuit includes an element which is responsive to electric current flow through said switching element greater than a given level to control the operation of said switching element for restricting an amount of the electric current flow through said switching element.

10. A driving circuit for driving a load based on a load control signal comprising:

a switching element responsive to the load control signal inputted to the driving circuit, said switching element being turned on for activating the load;

protective circuit means for monitoring a malfunction of said switching element, said protective circuit means providing a malfunction detected signal for restricting an operation of said switching element in response to the malfunction, said protective circuit means being arranged to be activated by the load control signal; and a switching element activation control circuit responsive to the malfunction detected signal provided from said protective circuit means to restrict the operation of said switching element, said switching element activation control circuit including means for neglecting the malfunction detected signal from said protective circuit means until the load control signal reaches a preselected level required for stable operation of said protective circuit means to correctly monitor the malfunction of said switching element.

11. A driving circuit for driving a load based on a load control signal comprising:

a power transistor responsive to the load control signal inputted to the driving circuit to activate the load;

a power terminal supplying the load control signal to the driving circuit as electric power;

a grounding terminal connecting the driving circuit to ground;

a drain terminal connecting between said power transistor and the load, an electric current flowing therethrough under activation of said power transistor;

a switching circuit arranged to selectively allow and block the electric current flow through said drain terminal, said switching circuit being connected to said power terminal through a first detection circuit, said first detection circuit detecting a first condition where a voltage of the power terminal is greater than a given level; and a second detection circuit detecting a second condition indicative of overheating or excessive current flow in said power transistor, said second detection circuit being connected to said power terminal, said switching circuit being turned on when said first detection circuit detects the first condition and said second detection circuit does not detect the second condition, said given level of said first condition corresponding to a voltage level required for stable operation of said second detection circuit to correctly detect the second condition, and said first and second detection circuit and said power transistor being connected to said grounding terminal.

12. A driving circuit for driving a load based on a load control signal, said driving circuit comprising:

a switching element for activating the load in response to the load control signal;

protective circuit means for monitoring a malfunction of said switching element, said protective circuit means performing a protective operation to restrict an operation of said switching element in response to the malfunction, said protective circuit means being arranged to be activated by the load control signal; and protective operation control means for controlling the protective operation of said protective circuit means, said protective operation control means prohibiting execution of the protective operation of said protective circuit until the load control signal reaches a preselected level required for stable operation of said protective circuit means to correctly monitor the malfunction of said switching element.

* * * * *